US012574009B2

(12) United States Patent (10) Patent No.: US 12,574,009 B2
Okunaga (45) Date of Patent: Mar. 10, 2026

(54) FILTER DEVICE

(71) Applicant: Murata Manufacturing Co., Ltd., Nagaokakyo (JP)

(72) Inventor: Hiromu Okunaga, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 213 days.

(21) Appl. No.: 18/636,702

(22) Filed: Apr. 16, 2024

(65) Prior Publication Data

US 2024/0275356 A1 Aug. 15, 2024

Related U.S. Application Data

(63) Continuation of application No. PCT/JP2022/043806, filed on Nov. 28, 2022.

(30) Foreign Application Priority Data

Dec. 2, 2021 (JP) ................................. 2021-196161

(51) Int. Cl.
*H03H 9/25* (2006.01)
*H03H 9/145* (2006.01)
*H03H 9/64* (2006.01)
(52) U.S. Cl.
CPC .............. *H03H 9/25* (2013.01); *H03H 9/145* (2013.01); *H03H 9/64* (2013.01); *H03H 9/6483* (2013.01)
(58) Field of Classification Search
CPC ........ H03H 9/25; H03H 9/145; H03H 9/6483; H03H 9/64

(Continued)

(56) References Cited

U.S. PATENT DOCUMENTS

2007/0267942 A1 11/2007 Matsumoto et al.
2008/0106354 A1* 5/2008 Kando ............... H03H 9/02228
333/193

(Continued)

FOREIGN PATENT DOCUMENTS

JP 2007312164 A 11/2007
JP 2020092422 A 6/2020

(Continued)

OTHER PUBLICATIONS

International Search Report in PCT/JP2022/043806, mailed Feb. 21, 2023, 3 pages.

(Continued)

*Primary Examiner* — Andrea Lindgren Baltzell
*Assistant Examiner* — Victor Cole
(74) *Attorney, Agent, or Firm* — Keating & Bennett, LLP

(57) ABSTRACT

A filter device includes acoustic wave resonators each including a piezoelectric substrate including a piezoelectric layer with first and second major surfaces, a first IDT electrode on the first major surface, and a second IDT electrode on the second major surface, and through electrodes penetrating the piezoelectric layer. Continuous circuits including acoustic wave resonators each including the first and second IDT electrodes are continuously connected. Each of the first and second IDT electrodes of the acoustic wave resonators includes a pair of busbars. The continuous circuits include wires each including the busbars. The wires located at ends of the continuous circuits are each an end portion wire including the busbars of the first and second IDT electrodes in each of the acoustic wave resonators provided with the busbars included in the end portion wires are connected by the through electrode.

20 Claims, 6 Drawing Sheets

(58) Field of Classification Search
USPC .......................................... 310/313; 333/193
See application file for complete search history.

(56) References Cited

U.S. PATENT DOCUMENTS

| | | | | |
|---|---|---|---|---|
| 2014/0145556 A1 | | 5/2014 | Kadota | |
| 2017/0353173 A1* | | 12/2017 | Sakurai ................. | H03H 9/059 |
| 2019/0273478 A1* | | 9/2019 | Lin ........................ | H03H 9/587 |
| 2020/0177159 A1 | | 6/2020 | Liu et al. | |
| 2023/0387881 A1 | | 11/2023 | Taniguchi et al. | |

FOREIGN PATENT DOCUMENTS

| | | | |
|---|---|---|---|
| WO | 2013021948 A1 | 2/2013 | |
| WO | 2022202916 A1 | 9/2022 | |

OTHER PUBLICATIONS

Written Opinion in PCT/JP2022/043806, mailed Feb. 21, 2023, 4 pages.

* cited by examiner

FILTER DEVICE

CROSS REFERENCE TO RELATED APPLICATIONS

This application claims the benefit of priority to Japanese Patent Application No. 2021-196161 filed on Dec. 2, 2021 and is a Continuation Application of PCT Application No. PCT/JP2022/043806 filed on Nov. 28, 2022. The entire contents of each application are hereby incorporated herein by reference.

BACKGROUND OF THE INVENTION

1. Field of the Invention

The present invention relates to filter devices each including multiple acoustic wave resonators.

2. Description of the Related Art

Filter devices including multiple acoustic wave resonators have heretofore been widely used in cellular phones and the like. Japanese Unexamined Patent Application Publication No. 2020-092422 discloses an example of an acoustic wave filter including multiple acoustic wave resonators. A configuration in which IDT (Interdigital Transducer) electrodes are provided on both major surfaces of a piezoelectric layer has been disclosed as an example of the acoustic wave resonator.

SUMMARY OF THE INVENTION

Regarding the acoustic wave filter described in Japanese Unexamined Patent Application Publication No. 2020-092422, in the case of using the acoustic wave resonator provided with the IDT electrodes on both of the major surfaces of the piezoelectric layer, filter characteristics are prone to be deteriorated unless a position to connect a wire on one major surface side of the piezoelectric layer to a wire on the other major surface side thereof is properly located.

Example embodiments of the present invention provide filter devices each capable of more reliably and easily reducing or preventing deterioration of filter characteristics.

A filter device according to an example embodiment of the present invention includes a plurality of acoustic wave resonators each including a piezoelectric substrate including a piezoelectric layer with a first major surface and a second major surface located opposite from each other, a first IDT electrode on the first major surface, and a second IDT electrode on the second major surface and located opposite from the first IDT electrode, a plurality of through electrodes penetrating the piezoelectric layer, and a continuous circuit including the plurality of acoustic wave resonators each including the first IDT electrode and the second IDT electrode and being continuously connected, in which each of the first IDT electrode and the second IDT electrode of the plurality of acoustic wave resonators includes a pair of busbars, the continuous circuit includes a plurality of wires and the wires include the busbars, the wires located at ends of the continuous circuit are each an end portion wire, and the end portion wire including the busbar of the first IDT electrode and the end portion wire including the busbar of the second IDT electrode in each of the acoustic wave resonators provided with the busbars included in the end portion wire are connected by the through electrode.

According to the filter devices of example embodiments of the present invention, it is possible to more reliably and easily reduce or prevent deterioration of filter characteristics.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

The present invention will be clarified by describing specific example embodiments of the present invention below with reference to the drawings.

Note that the respective example embodiments described in the present specification are merely examples, and it is pointed out that partial replacement or combination of configurations among different example embodiments are feasible.

Figure 1:
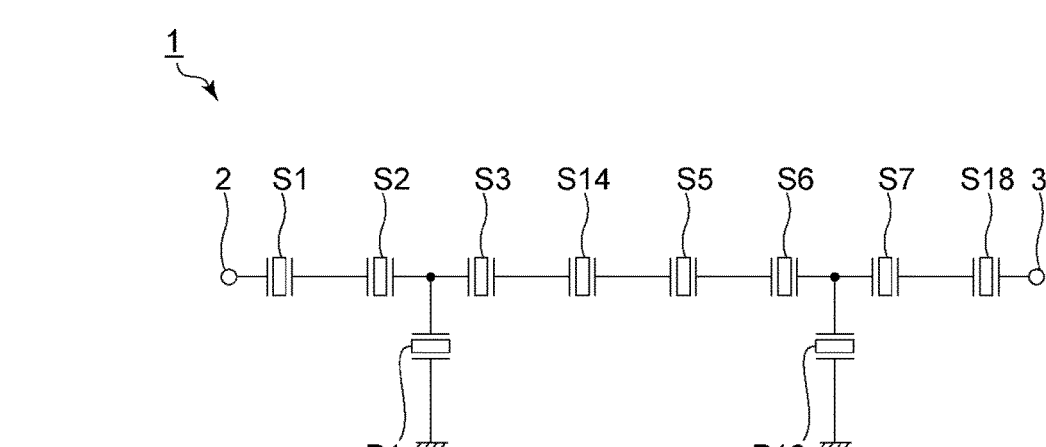
FIG. 1 is a circuit diagram of a filter device according to a first example embodiment of the present invention.
Figure 2:
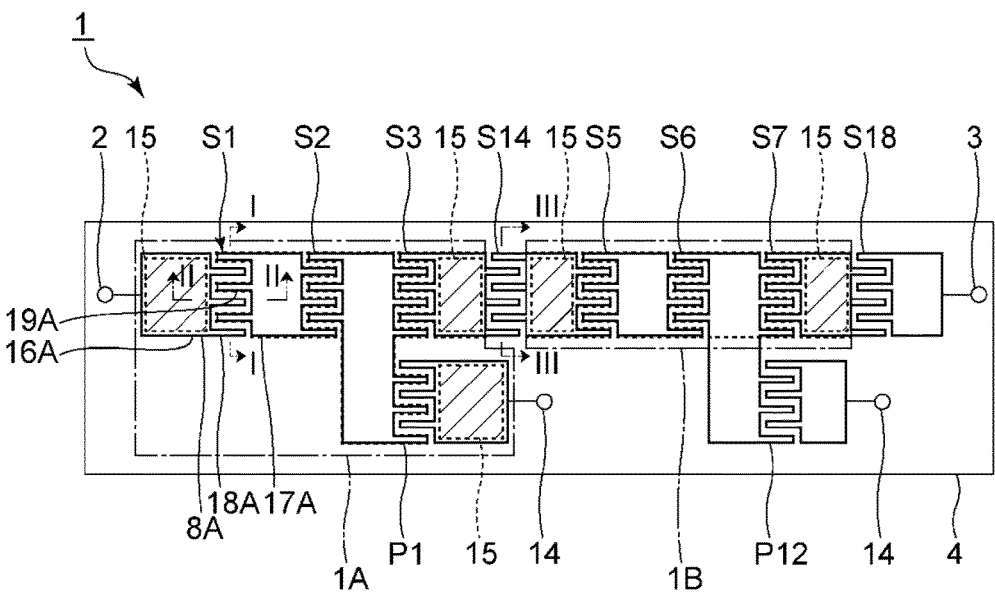
FIG. 2 is a schematic plan view of the filter device according to the first example embodiment of the present invention.

FIG. 1 is a circuit diagram of a filter device according to a first example embodiment of the present invention. FIG. 2 is a schematic plan view of the filter device according to the first example embodiment. Here, reflectors to be described later are omitted in FIG. 2. Moreover, in FIG. 2, portions provided with through electrodes to be described later are indicated with hatching. The same applies to other schematic plan views.

As illustrated in FIG. 1, a filter device 1 of the present example embodiment is a ladder filter. The filter device 1 includes a first signal terminal 2, a second signal terminal 3, multiple series arm resonators, and multiple parallel arm resonators. As illustrated in FIG. 2, the filter device 1 includes multiple ground terminals 14. The ground terminals 14 are connected to a ground potential. The first signal terminal 2, the second signal terminal 3, and the ground terminals 14 may be electrode pads or wires, for example. In the filter device 1, all the series arm resonators and all the parallel arm resonators are acoustic wave resonators.

Back to FIG. 1, the multiple series arm resonators of the present example embodiment specifically include a series arm resonator S1, a series arm resonator S2, a series arm resonator S3, a series arm resonator S14, a series arm resonator S5, a series arm resonator S6, a series arm resonator S7, and a series arm resonator S18. The multiple series arm resonators are connected in series to one another between the first signal terminal 2 and the second signal terminal 3.

The multiple parallel arm resonators specifically include a parallel arm resonator P1 and a parallel arm resonator P12. The parallel arm resonator P1 is connected between the ground potential and a connecting point that is located between the series arm resonator S2 and the series arm resonator S3. The parallel arm resonator P12 is connected between the ground potential and a connecting point that is located between the series arm resonator S6 and the series arm resonator S7. Note that a circuit configuration of the filter device 1 is not limited to the above-described configuration. In the case where the filter device 1 is the ladder filter, the filter device 1 only needs to include at least one series arm resonator and at least one parallel arm resonator.

The filter device 1 includes multiple first acoustic wave resonators and multiple second acoustic wave resonators. The multiple second acoustic wave resonators in the present example embodiment include the series arm resonator S14, the series arm resonator S18, and the parallel arm resonator P12. On the other hand, the multiple first acoustic wave resonators include all the series arm resonators and the parallel arm resonators other than the second acoustic wave resonators. Specifically, the multiple first acoustic wave resonators include the series arm resonator S1, the series arm resonator S2, the series arm resonator S3, the series arm resonator S5, the series arm resonator S6, the series arm resonator S7, and the parallel arm resonator P1.

Figure 3:
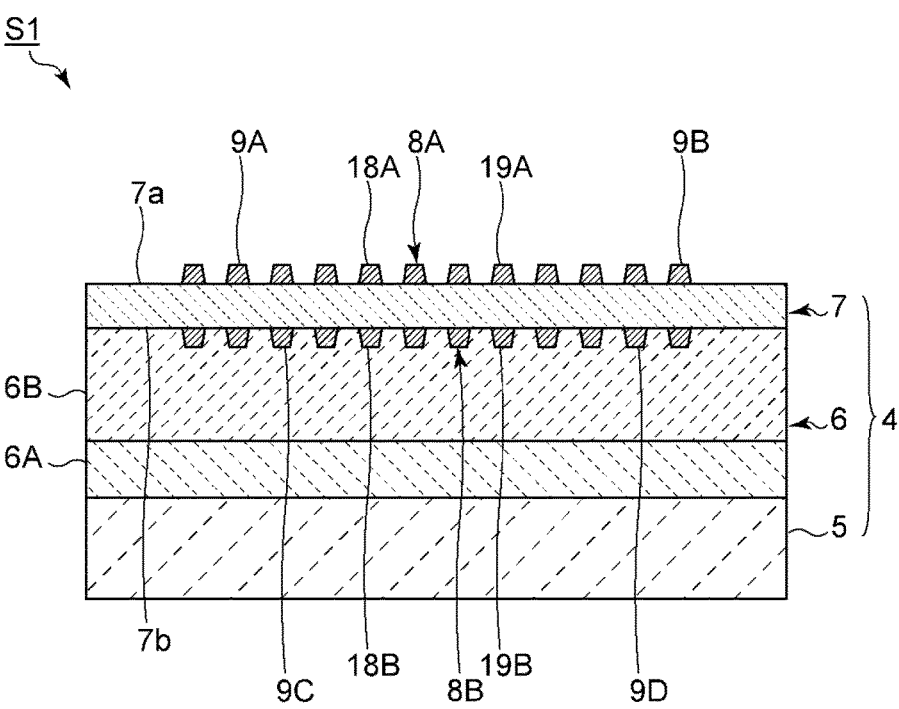
FIG. 3 is a cross-sectional view taken along line I-I in FIG. 2.
Figure 4:
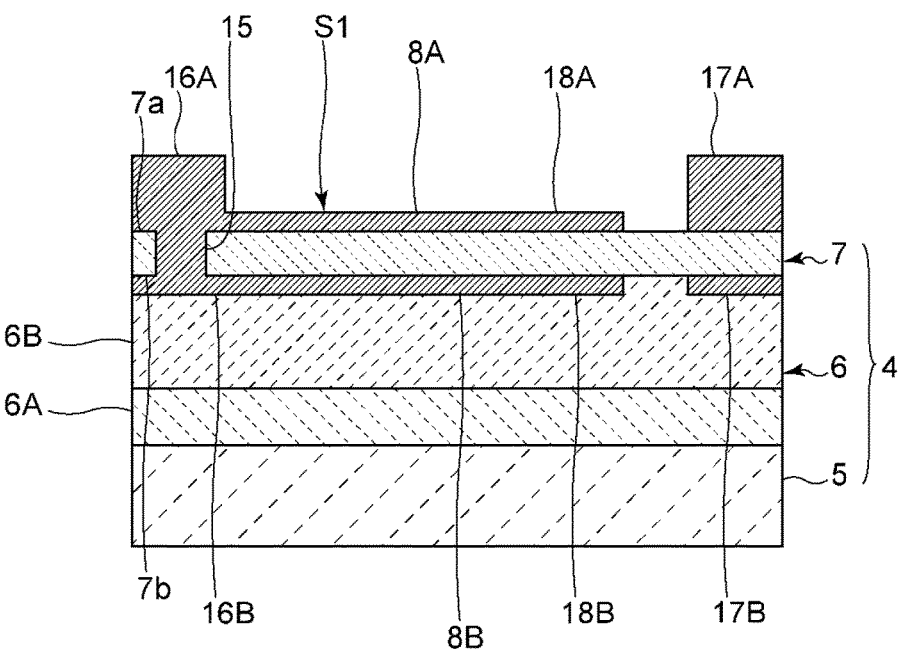
FIG. 4 is a cross-sectional view taken along line II-II in FIG. 2.

FIG. 3 is a cross-sectional view taken along line I-I in FIG. 2. FIG. 4 is a cross-sectional view taken along line II-II in FIG. 2.

As illustrated in FIG. 3, the series arm resonator S1 as the first acoustic wave resonator includes a piezoelectric substrate 4. To be more precise, in the present example embodiment, all the acoustic wave resonators including the series arm resonator S1 share the piezoelectric substrate 4. Nonetheless, each acoustic wave resonator may be individually provided with a piezoelectric substrate, for example.

The piezoelectric substrate 4 includes a support substrate 5, an intermediate layer 6, and a piezoelectric layer 7. More specifically, the intermediate layer 6 includes a first layer 6A and a second layer 6B. The first layer 6A is provided on the support substrate 5. The second layer 6B is provided on the first layer 6A. The piezoelectric layer 7 is provided on the second layer 6B. That is to say, the "piezoelectric substrate" in the present application means a substrate having piezoelectricity.

The piezoelectric layer 7 includes a first major surface 7a and a second major surface 7b. The first major surface 7a and the second major surface 7b are located opposite from each other. The first major surface 7a of the piezoelectric layer 7 is provided with a first IDT electrode 8A. The second major surface 7b is provided with a second IDT electrode 8B. The first IDT electrode 8A and the second IDT electrode 8B are located opposite from each other while interposing the piezoelectric layer 7 in between.

As illustrated in FIG. 2, the first IDT electrode 8A includes a first busbar 16A, a second busbar 17A, multiple first electrode fingers 18A, and multiple second electrode fingers 19A. The first busbar 16A and the second busbar 17A are opposed to each other. End portions of the multiple first electrode fingers 18A are connected to the first busbar 16A. End portions of the multiple second electrode fingers 19A are connected to the second busbar 17A. The multiple first electrode fingers 18A and the multiple second electrode fingers 19A are interdigitated with one another.

In the following, the first busbar and the second busbar as a whole may be simply referred to as the busbars. In the present example embodiment, two series arm resonators located adjacent to each other share one of the busbars. In the present specification, the shared busbar may be described as the busbar of one of the acoustic wave resonators. Moreover, in the following, the first electrode fingers and the second electrode fingers as a whole may be simply referred to as the electrode fingers.

The second IDT electrode 8B illustrated in FIG. 3 also includes a pair of busbars and multiple electrode fingers as with the first IDT electrode 8A. More specifically, the multiple electrode fingers of the second IDT electrode 8B include multiple first electrode fingers 18B and multiple second electrode fingers 19B. As illustrated in FIG. 4, a first busbar 16B and a second busbar 17B define the pair of busbars of the second IDT electrode 8B. Each of the first acoustic wave resonators other than the series arm resonator S1 also includes a first IDT electrode and a second IDT electrode likewise.

The filter device 1 includes multiple through electrodes 15. The through electrodes 15 penetrate the piezoelectric layer 7. One of the multiple through electrodes 15 connects the first busbar 16A of first IDT electrode 8A to the first busbar 16B of the second IDT electrode 8B in the series arm resonator S1. In this way, electric potentials of the multiple first electrode fingers 18A of the first IDT electrode 8A and electric potentials of the multiple first electrode fingers 18B of the second IDT electrode 8B are set equal.

Figure 5:
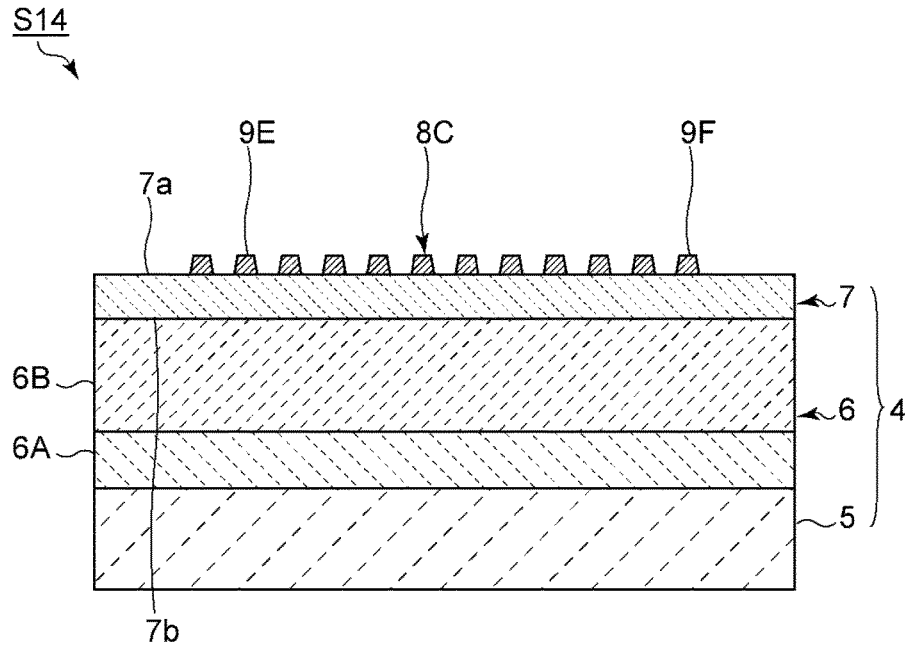
FIG. 5 is a cross-sectional view taken along line III-III in FIG. 2.

FIG. 5 is a cross-sectional view taken along line III-III in FIG. 2.

The series arm resonator S14 as the second acoustic wave resonator includes the piezoelectric substrate 4. Here, the piezoelectric layer of the piezoelectric substrate in the second acoustic wave resonator of the present invention includes a third major surface and a fourth major surface. Nonetheless, in the present example embodiment, the second acoustic wave resonator shares the piezoelectric substrate 4 with the first acoustic wave resonator as mentioned above. Accordingly, the third major surface and the first major surface 7a are the same major surface. The fourth major surface and the second major surface 7b are the same major surface.

The first major surface 7a of the piezoelectric layer 7 is provided with a third IDT electrode 8C. As with the above-mentioned first IDT electrode 8A, the third IDT electrode 8C includes a pair of busbars and multiple electrode fingers. Here, the third IDT electrode 8C only needs to be provided on one of the first major surface 7a as the third major surface and the second major surface 7b as the fourth major surface.

Back to FIG. 2, the filter device 1 includes a continuous circuit 1A and a continuous circuit 1B. The continuous circuits 1A and 1B are circuits in which the first acoustic wave resonators are directly connected without the intermediary of the second acoustic wave resonators. The continuous circuit 1A includes the series arm resonator S1, the series arm resonator S2, the series arm resonator S3, and the parallel arm resonator P1 as the first acoustic wave resonators. The continuous circuit 1B includes the series arm resonator S5, the series arm resonator S6, and the series arm resonator S7 as the first acoustic wave resonators.

The continuous circuit 1A includes multiple wires. The multiple wires include end portion wires and non-end portion wires. An end portion wire is a wire located at an end of the continuous circuit 1A. The end portion wire includes the busbar out of the multiple busbars, which is located at the end of the continuous circuit. On the other hand, a non-end portion wire is a wire located at a position other than the end of the continuous circuit 1A. The non-end portion wire includes the busbar out of the multiple busbars, which is not located at the end of the continuous circuit. Each of the end portion wires and the non-end portion wires as the wires in example embodiments of the present invention may be any of the busbars of the first IDT electrode and of the second IDT electrode, or may include a busbar, a routing wire, and the like. Likewise, the continuous circuit 1B also includes the end portion wires and non-end portion wires.

The first busbar 16A of the first IDT electrode 8A in the series arm resonator S1 is included in the end portion wires. Likewise, the first busbar 16B of the second IDT electrode 8B in the series arm resonator S1 is also included in the end portion wires. Moreover, one of the busbars of each of the first IDT electrode and the second IDT electrode in each of the series arm resonator S3 and the parallel arm resonator P1 is also included in the end portion wires. One of the busbars of each of the first IDT electrode and the second IDT electrode in each of the series arm resonator S5 and the series arm resonator S7 of the continuous circuit 1B is also included in the end portion wires.

One of the unique features of the present example embodiment is that the end portion wire including the busbar of the first IDT electrode and the end portion wire including the busbar of the second IDT electrode in each acoustic wave resonator provided with the busbars included in the end portion wires are connected by the through electrode 15. Accordingly, it is possible to reduce or prevent deterioration of filter characteristics more reliably and easily. This will be described below. Here, in the case where the end portion wire includes the busbar and the routing wire, the state where the end portion wire is connected to the through electrode 15 is assumed to include the following cases 1) to 3): 1) a case where only the busbar portion in the end portion wire is connected to the through electrode 15; 2) a case where only the routing wire portion in the end portion wire is connected to the through electrode 15; and 3) a case where both of the busbar portion and the routing wire portion in the end portion wire are connected to the through electrode 15.

In the piezoelectric substrate being a laminated substrate, another layer is provided on the second major surface of the piezoelectric layer. For this reason, a thickness of a wire provided on the second major surface is apt to be small. Accordingly, electrical resistance of the relevant wire is apt to be high. In the case where the electrical resistance of the wire connecting the first IDT electrode to the second IDT electrode is high, an insertion loss of the filter device becomes large. In addition, phases of the first IDT electrode and the second IDT electrode are prone to be shifted. Due to this phase shift, a spurious component is more likely to occur.

On the other hand, in the filter device 1, the end portion wires including the busbars of the first IDT electrode and the second IDT electrode are connected by the through electrode 15. Accordingly, connection between the busbars does not require the wire on the second major surface 7b side of the piezoelectric layer 7 or a long-distance routing wire. In addition, since the through electrode 15 is the wire that connects the first IDT electrode and the second IDT electrode, the length of this wire is short. Specifically, a dimension as the length of the wire is equal to a dimension as a thickness of the piezoelectric layer 7. Accordingly, it is possible to reduce the electrical resistance of the wire that connects the first IDT electrode and the second IDT electrode. In this way, the difference between the phase of the first IDT electrode provided on the first major surface 7a of the piezoelectric layer 7 and the phase of the second IDT electrode provided on the second major surface 7b thereof can be reduced more reliably and easily. Moreover, symmetry of the drive of the first IDT electrode and of the second IDT electrode is maintained. Accordingly, deterioration of filter characteristics can be reduced or prevented more reliably and easily. More specifically, it is possible to reduce or prevent an increase in insertion loss or generation of a spurious component in the filter device 1.

More details of the configuration of the present example embodiment will be described below.

In the series arm resonator S1 illustrated in FIG. 3, electrode finger pitches of the first IDT electrode 8A and of the second IDT electrode 8B are equal. Here, the electrode finger pitch is a distance between the centers of the electrode fingers located adjacent to each other. In the present specification, the state where the electrode finger pitches are equal also includes a state where the electrode finger pitches are different within such an error range that does not affect electrical characteristics of the acoustic wave resonator.

An acoustic wave is excited by applying an alternating-current voltage to the first IDT electrode 8A and the second IDT electrode 8B. A pair of a reflector 9A and a reflector 9B are provided on both sides in an acoustic wave propagating direction of the first IDT electrode 8A on the first major surface 7a of the piezoelectric layer 7. Likewise, a pair of a reflector 9C and a reflector 9D are provided on both sides in the acoustic wave propagating direction of the second IDT electrode 8B on the second major surface 7b. These reflectors 9A, 9B, 9C, and 9D may have the same electric potential as that of one of the busbars of the first IDT electrode 8A or the same electric potential as that of one of the busbars of the second IDT electrode 8B. Alternatively, the reflectors 9A, 9B, 9C, and 9D may have the same electric potential as that of both of one of the busbars of the first IDT electrode 8A and one of the busbars of the second IDT electrode 8B. Nonetheless, the respective reflectors may be floating electrodes. As described above, the first acoustic wave resonator of the present example embodiment is a surface acoustic wave resonator. Note that a floating electrode is an electrode connected neither to a signal potential nor to the ground potential.

Each first acoustic wave resonator other than the series arm resonator S1 also includes two pairs of reflectors likewise. Moreover, as illustrated in FIG. 5, the series arm resonator S14 as the second acoustic wave resonator also includes a reflector 9E and a reflector 9F. More specifically, the pair of the reflector 9E and the reflector 9F are provided on both sides in the acoustic wave propagating direction of the third IDT electrode 8C on the first major surface 7a of the piezoelectric layer 7. The reflectors 9E and 9F may have the same electric potential as that of one of the busbars of the third IDT electrode 8C, or may be floating electrodes. Each second acoustic wave resonator other than the series arm resonator S14 also includes a pair of reflectors likewise. As described above, the second acoustic wave resonator of the present example embodiment is a surface acoustic wave resonator. In the present example embodiment, Al is used in each IDT electrode and each reflector in each of the first acoustic wave resonators and each of the second acoustic wave resonators. Nonetheless, the material of each IDT electrode and each reflector is not limited to the above-described material. Instead, each IDT electrode and each reflector may include a laminated metal film.

Figure 6:
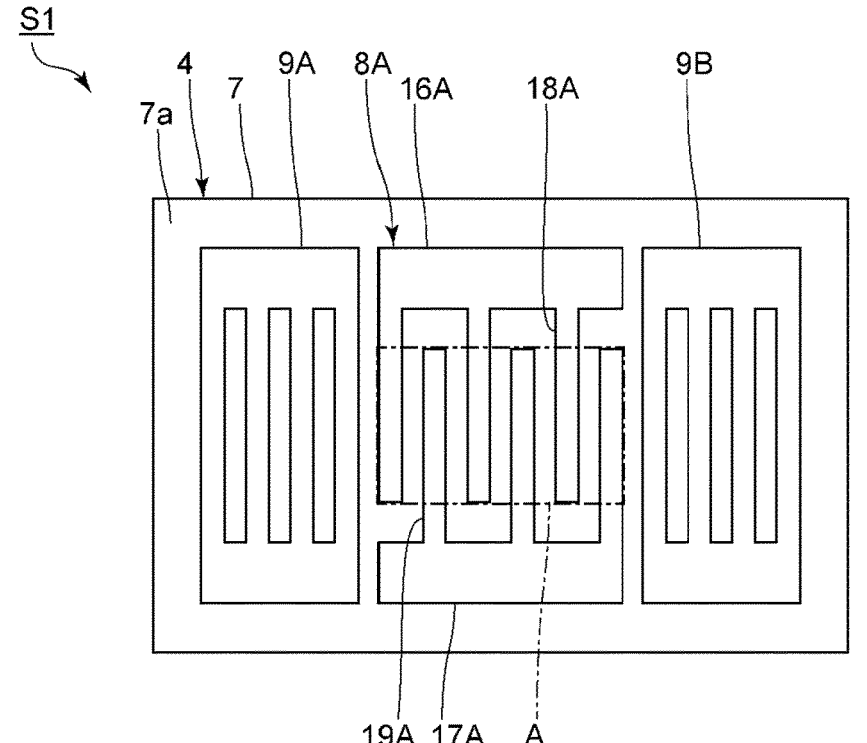
FIG. 6 is a plan view of a first acoustic wave resonator according to the first example embodiment of the present invention.

FIG. 6 is a plan view of the first acoustic wave resonator according to the first example embodiment. Here, the wires connected to the series arm resonator S1 as the first acoustic wave resonator are omitted in FIG. 6.

In the first IDT electrode 8A, a region where the electrode fingers located adjacent to each other overlap each other is an intersecting region A when viewed in the acoustic wave propagating direction. Likewise, the second IDT electrode 8B also has an intersecting region. Here, the acoustic wave propagating direction is defined as a direction orthogonal to a direction in which the multiple electrode fingers of the IDT electrodes extend. The intersecting region A of the first IDT electrode 8A and the intersecting region of the second IDT electrode 8B overlap each other in plan view. More specifically, centers of the multiple electrode fingers in the intersecting region A of the first IDT electrode 8A overlap centers of the multiple electrode fingers in the intersecting region of the second IDT electrode 8B in plan view. Nonetheless, at least a portion of the multiple electrode fingers of the first IDT electrode 8A only needs to overlap at least a portion of the multiple electrode fingers of the second IDT electrode 8B in plan view. That is to say, the state of overlap only needs to fall in an error range to the extent that does not affect the electrical characteristics of the acoustic wave resonators, and a displacement due to a manufacturing variation is included in the state of overlap. Here, the plan view is a direction viewed from above in FIG. 3 or FIG. 4. In FIG. 3 and FIG. 4, for example, the piezoelectric layer 7 side out of the piezoelectric layer 7 side and the support substrate 5 side extends upward.

Both the first acoustic wave resonator and the second acoustic wave resonator are provided in the present example embodiment. Nonetheless, the second acoustic wave resonator does not always have to be provided. The filter device 1 only needs to include the multiple first acoustic wave resonators.

As illustrated in FIG. 2, each of the continuous circuit 1A and the continuous circuit 1B includes three or more first acoustic wave resonators. Note that the continuous circuit only needs to include at least two first acoustic wave resonators in an example embodiment of the present invention.

Examples of materials of the piezoelectric substrate 4 will be discussed below.

In the present example embodiment, lithium tantalate is used in the piezoelectric layer 7. Note that the material of the piezoelectric layer 7 is not limited to the above-mentioned material, and any of lithium niobate, zinc oxide, aluminum nitride, quartz crystal, and PZT (lead zirconate titanate), and the like can also be used, for example. Nonetheless, it is preferable to use lithium niobate or lithium tantalate as the material of the piezoelectric layer 7.

In the present example embodiment, the first layer 6A of the intermediate layer 6 is a high acoustic velocity film. The high acoustic velocity film is a film having a relatively high acoustic velocity. More specifically, an acoustic velocity of a bulk wave that propagates in the high acoustic velocity film is higher than an acoustic velocity of an acoustic wave that propagates in the piezoelectric layer 7.

In the present example embodiment, silicon nitride is used as a material of the first layer 6A. Here, in the case of forming the first layer 6A as the high acoustic velocity film, any of a piezoelectric body such as aluminum nitride, lithium tantalate, lithium niobate, or quartz crystal, a ceramic such as alumina, sapphire, magnesia, silicon nitride, silicon carbide, zirconia, cordierite, mullite, steatite, forsterite, spinel, or SiAlON, a dielectric body such as aluminum oxide, silicon oxynitride, DLC (diamond-like carbon), or diamond, a semiconductor such as silicon, or a material including one of the aforementioned materials as a main component can also be used as the material of the first layer, for example. Note that an aluminum compound including oxygen and one or more of Mg, Fe, Zn, Mn, or the like is included in the aforementioned spinel. Examples of the above-mentioned spinel include $MgAl_2O_4$, $FeAl_2O_4$, $ZnAl_2O_4$, or $MnAl_2O_4$.

In the present example embodiment, the second layer 6B of the intermediate layer 6 is a low acoustic velocity film. The low acoustic velocity film is a film having a relatively low acoustic velocity. More specifically, the acoustic velocity of the bulk wave that propagates in the low acoustic velocity film is lower than the acoustic velocity of the bulk wave that propagates in the piezoelectric layer 7.

In the present example embodiment, silicon oxide is used as a material of the second layer 6B. Here, in the case of forming the second layer 6B as the low acoustic velocity film, a material including, as a main component, glass, silicon oxynitride, lithium oxide, tantalum pentoxide, or a compound including silicon oxide with addition of fluorine, carbon or boron can also be used as the material of the second layer 6B, for example.

In the present example embodiment, silicon is used as a material of the support substrate 5. Note that the material of the support substrate 5 is not limited to the aforementioned material, and any of a piezoelectric body such as aluminum oxide, lithium tantalate, lithium niobate, or quartz crystal, one of various ceramics including alumina, sapphire, magnesia, silicon nitride, aluminum nitride, silicon carbide, zirconia, cordierite, mullite, steatite, forsterite, or the like, a dielectric body such as diamond or glass, a semiconductor such as gallium nitride, a resin, or the like can also be used, for example.

In the present example embodiment, the first layer 6A as the high acoustic velocity film, the second layer 6B as the low acoustic velocity film, and the piezoelectric layer 7 are laminated in this order in the piezoelectric substrate 4. Thus, it is possible to confine energy of the acoustic wave effectively to the piezoelectric layer 7 side. Nonetheless, the first layer 6A need not be the high acoustic velocity film. The second layer 6B need not be the low acoustic velocity film.

Here, the number of layers in the intermediate layer 6 is not limited to two layers. The intermediate layer 6 may be a laminated film including three or more layers or may be a single-layered film. The intermediate layer 6 does not always have to be provided. The piezoelectric substrate 4 may be, for example, a laminated substrate of the support substrate 5 and the piezoelectric layer 7. Nonetheless, it is preferable to provide the intermediate layer 6. In this way, it is possible to form the piezoelectric substrate 4 easily into a laminated substrate even in the case where the second IDT electrode is provided.

The first major surface 7a of the piezoelectric layer 7 may be provided with a dielectric film in such a way as to cover the first IDT electrode of the first acoustic wave resonator. Likewise, the first major surface 7a may be provided with a dielectric film in such a way as to cover the third IDT electrode of the second acoustic wave resonator. In this case, the first IDT electrode and the third IDT electrode are less likely to be damaged. For example, silicon oxide, silicon nitride, silicon oxynitride, and the like can be used as the dielectric film.

In the first example embodiment, only the end portion wires including the busbars of the first IDT electrodes and the second IDT electrodes are connected to each other by the through electrode 15. However, the present invention is not limited to this configuration. Examples in which the portions provided with the through electrodes 15 are different from those of the first example embodiment will be discussed below.

Figure 7:
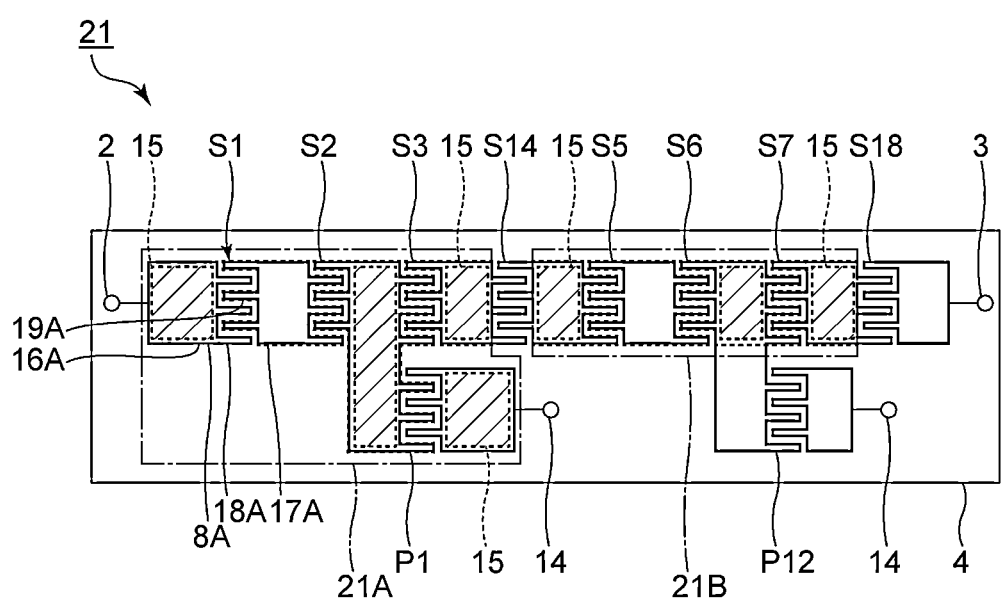
FIG. 7 is a schematic plan view of a filter device according to a second example embodiment of the present invention.

FIG. 7 is a schematic plan view of a filter device according to a second example embodiment.

The present example embodiment is different from the first example embodiment in that the above-mentioned non-end portion wires including the busbars of the first IDT electrode and the second IDT electrode are connected by the through electrode 15. Except for the aforementioned point, a filter device 21 of the present example embodiment has the same configuration as that of the filter device 1 of the first example embodiment.

As described above, the non-end portion wire is a wire in the continuous circuit which is located at a position other than the end of the continuous circuit. The end portion wire is connected to an outer side portion of the continuous circuit. On the other hand, the non-end portion wire is shared by, for example, the mutually adjacent first acoustic wave resonators in the continuous circuit. Otherwise, the non-end portion wires of the mutually adjacent first acoustic wave resonators in the continuous circuit are connected to each other.

In the filter device 21, the non-end portion wires including the busbars of the first IDT electrodes and the second IDT electrodes of a certain portion in a continuous circuit 21A are connected to one another by the through electrodes 15. Specifically, the non-end portion wires including the busbars of the respective first IDT electrodes in the series arm resonator S2 and the series arm resonator S3 and the non-end portion wires including the busbars of the respective second IDT electrodes in the respective series arm resonators are connected to one another by the through electrodes 15. Likewise, the non-end portion wires including the busbars in the parallel arm resonator P1 are connected to each other by the through electrode 15.

In addition, the non-end portion wires including the busbars of the first IDT electrodes and the second IDT electrodes of a certain portion in a continuous circuit 21B are connected to one another by the through electrodes 15. Specifically, the non-end portion wires including the busbars of the respective first IDT electrodes in the series arm resonator S6 and the series arm resonator S7 and the non-end portion wires including the busbars of the respective second IDT electrodes in the respective series arm resonators are connected to one another by the through electrodes 15.

Here, as with the first example embodiment, in the series arm resonator S1, the series arm resonator S3, the series arm resonator S5, the series arm resonator S7, and the parallel arm resonator P1, the end portion wires including the respective busbars therein are connected to one another by the through electrodes 15.

As in the present example embodiment, the non-end portion wire including the busbar of the first IDT electrode and the non-end portion wire including the busbar of the second IDT electrode in at least one first acoustic wave resonator of the continuous circuit are preferably connected by the through electrode 15. In this case, since the through electrode 15 is the wire that connects the first IDT electrode and the second IDT electrode including the non-end portion wires, electrical resistance of the wire is small. Accordingly, a phase difference between the above-described first IDT electrode and the above-described second IDT electrode can be reduced more reliably and easily. Thus, it is possible to reduce or prevent deterioration of filter characteristics more reliably and easily.

Figure 8:
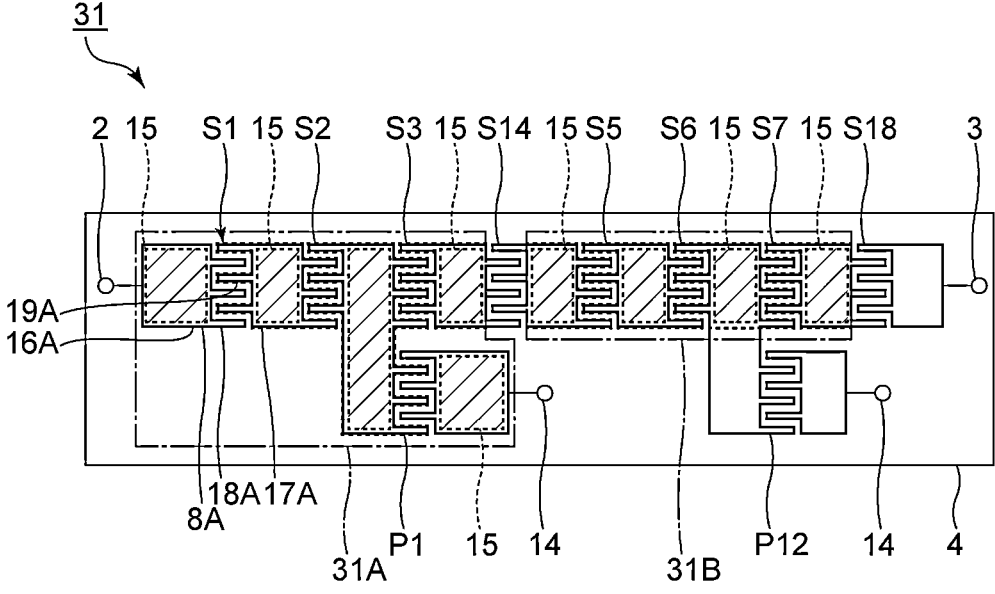
FIG. 8 is a schematic plan view of a filter device according to a third example embodiment of the present invention.

FIG. 8 is a schematic plan view of a filter device according to a third example embodiment.

The present example embodiment is different from the first example embodiment in that the non-end portion wires including the busbars of the first IDT electrodes and the non-end portion wires including the busbars of the second IDT electrodes in all of the acoustic wave resonators in a continuous circuit 31A and a continuous circuit 31B are connected by the through electrodes 15. Except for the aforementioned point, a filter device 31 of the present example embodiment has the same configuration as that of the filter device 21 of the second example embodiment.

In the filter device 31, the busbars of one of the set of the first IDT electrodes and the set of the second IDT electrodes in all of the first acoustic wave resonators in the continuous circuit and the busbars of the other set are electrically connected to one another by the through electrodes 15. Accordingly, the phase difference between the first IDT electrode and the second IDT electrode in every first acoustic wave resonator in the continuous circuit can be reduced more reliably and easily. Thus, it is possible to reduce or prevent deterioration of filter characteristics even more reliably and easily.

Figure 9:
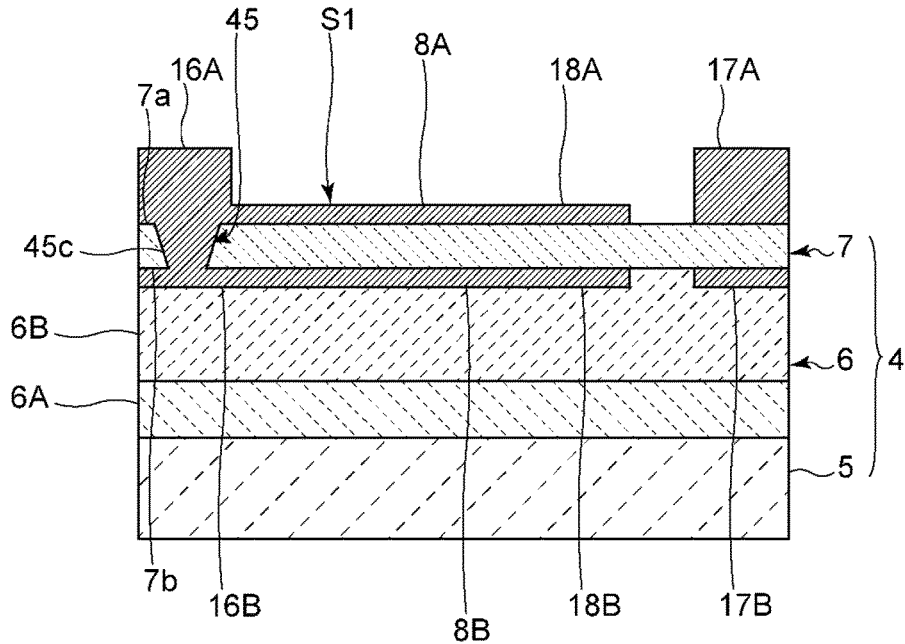
FIG. 9 is a cross-sectional view of a first acoustic wave resonator according to a fourth example embodiment of the present invention, which is taken along a direction in which electrode fingers extend.

FIG. 9 is a cross-sectional view of a first acoustic wave resonator according to a fourth example embodiment, which is taken along a direction in which electrode fingers extend.

A shape in cross-sectional view of a through electrode 45 of the present example embodiment is different from that of the first example embodiment. Except for the aforementioned point, a filter device of the present example embodiment has the same configuration as that of the filter device 1 of the first example embodiment.

The through electrode 45 includes a side surface 45c. The side surface 45c is a surface of the through electrode 45 facing the piezoelectric layer 7. The side surface 45c is inclined with respect to a line normal to the first major surface 7a of the piezoelectric layer 7. More specifically, the side surface 45c is inclined such that a width of the through electrode 45 is gradually reduced from the first major surface 7a side toward the second major surface 7b side. The width of the through electrode 45 is a dimension of the through electrode 45 in a direction parallel to the direction in which the electrode fingers extend.

Figure 10:
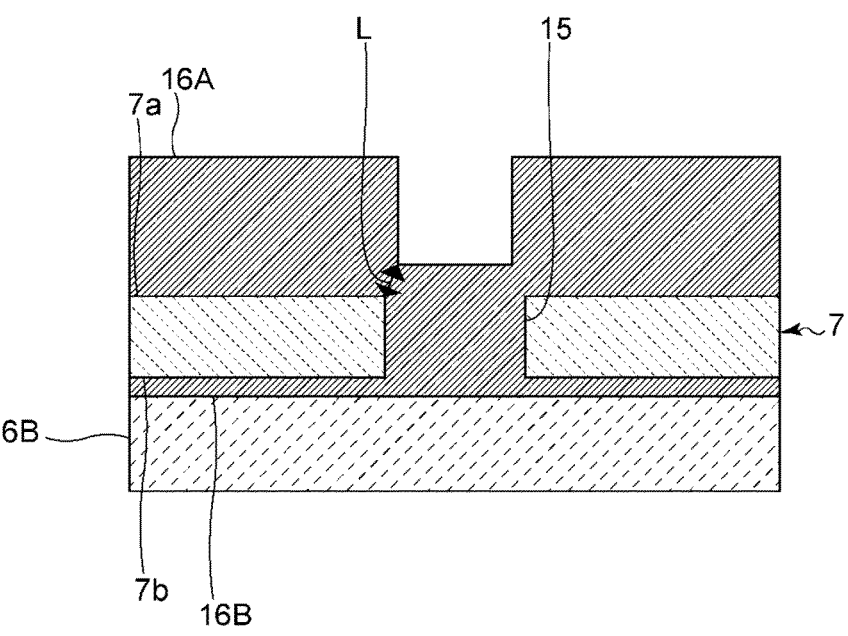
FIG. 10 is a cross-sectional view of the neighborhood of a through electrode for explaining a configuration in a case where the through electrode and a busbar are integrally formed and the busbar is provided with a recess.

In the meantime, the through electrodes and the busbars may be integrally formed at the same time in a manufacturing process. In this case, a recess may actually be formed at a portion of the first busbar 16A overlapping the through electrode 15 in plan view as illustrated in FIG. 10. A distance L from an outer peripheral edge at a bottom surface of the recess to an outer peripheral edge of the through electrode 15 is short. Accordingly, when a stress is applied between the first busbar 16A and the through electrode 15, a crack may develop in the first busbar 16A.

Figure 11:
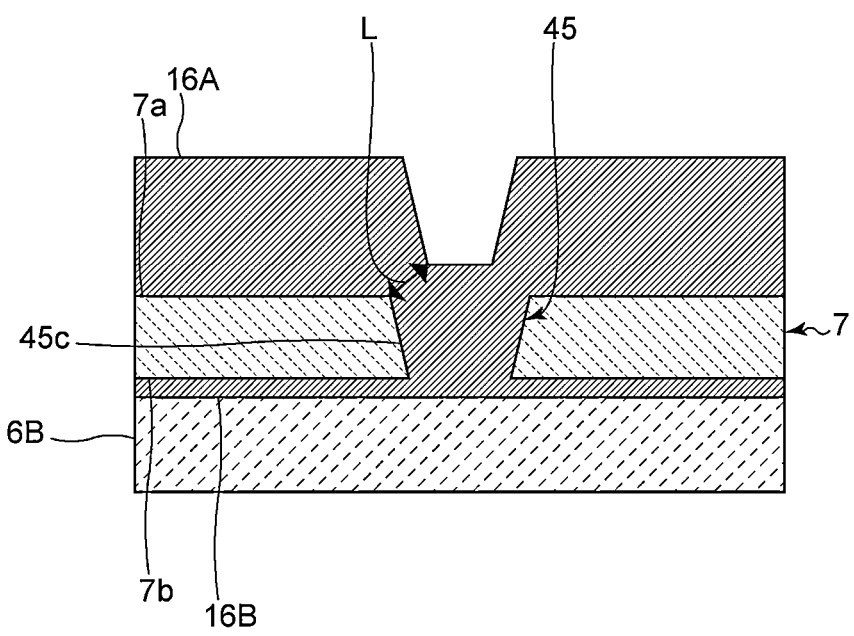
FIG. 11 is a cross-sectional view of the neighborhood of a through electrode for explaining a configuration in a case where the through electrode with an inclined side surface and a busbar are integrally formed and the busbar is provided with a recess.

On the other hand, in the present example embodiment, the side surface 45c of the through electrode 45 is inclined. Accordingly, when the first busbar 16A is provided with the recess, an inner wall of the recess is inclined as illustrated in FIG. 11. For this reason, an outer peripheral edge at a bottom surface of the recess is located on a central side of the recess relative to an outer peripheral edge of an opening portion of the recess in plan view. In this case, a distance L from the outer peripheral edge at the bottom surface of the recess to an outer peripheral edge of the through electrode 45 is long. Accordingly, it is possible to reduce or prevent development of a crack in the first busbar 16A provided with the recess.

In addition, in the present example embodiment, the end portion wire including the busbar of the first IDT electrode is connected to the end portion wire including the busbar of the second IDT electrode by the through electrode 45 as with the first example embodiment. Accordingly, it is possible to reduce or prevent deterioration of filter characteristics more reliably and easily.

Here, the end portion wire including the busbar in one first acoustic wave resonator is not connected to another first acoustic wave resonator. For this reason, it is easy to increase an area of the end portion wire. Accordingly, it is possible to connect the end portion wires including the busbars of the first IDT electrode and the second IDT electrode to each other easily by the through electrode 45 with the inclined side surface 45c. Nonetheless, the non-end portion wires including the busbars of the first IDT electrode and the second IDT electrode may be connected to each other by the through electrode 45.

Figure 12:
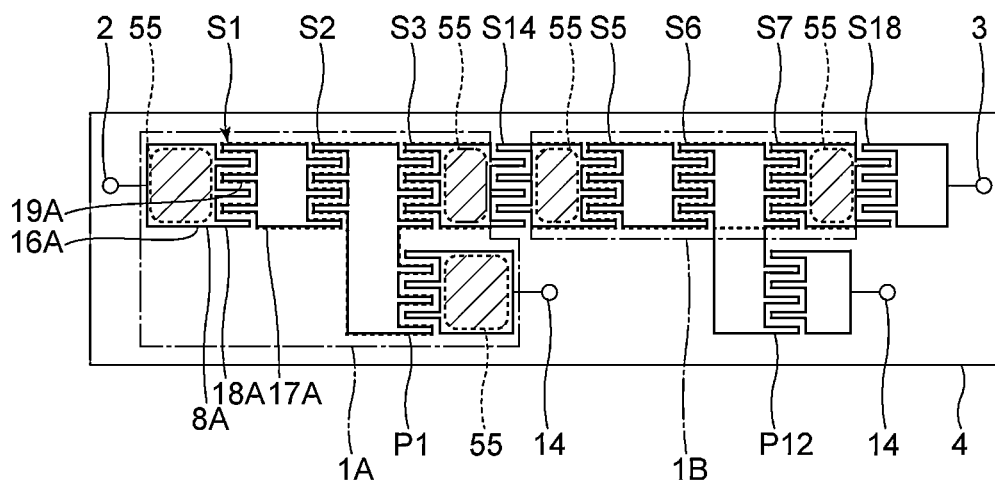
FIG. 12 is a schematic plan view of a filter device according to a fifth example embodiment of the present invention.

FIG. 12 is a schematic plan view of a filter device according to a fifth example embodiment.

The present example embodiment is different from the first example embodiment in that shapes in plan view of multiple through electrodes 55 are shapes not provided with angulated portions. Here, an angulated portion is a portion having a bent shape such as a vertex of a polygon. Except for the aforementioned point, the filter device of the present example embodiment has the same configuration as that of the filter device 1 of the first example embodiment.

The shapes in plan view of the multiple through electrodes 55 are rectangular or substantially rectangular shapes, for example. More specifically, the shapes in plan view of the multiple through electrodes 55 are shapes in which corner portions of the rectangles are formed into curved shapes. Accordingly, it is possible to disperse a stress to be applied between the busbars and the through electrodes 55. Accordingly, the busbars hardly causes cracks. Nonetheless, the shapes in plan view of the multiple through electrodes 55 are not limited to the above-described shapes and may be an ellipse, an approximate ellipse, or the like, for example.

In addition, in the present example embodiment, the end portion wire including the busbar of the first IDT electrode is connected to the end portion wire including the busbar of the second IDT electrode by the through electrode 55 as with the first example embodiment. Accordingly, it is possible to reduce or prevent deterioration of filter characteristics more reliably and easily.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
a plurality of acoustic wave resonators each including:
a piezoelectric substrate including a piezoelectric layer with a first major surface and a second major surface located opposite from each other;
a first IDT electrode on the first major surface; and
a second IDT electrode on the second major surface and located opposite from the first IDT electrode;
a plurality of through electrodes penetrating the piezoelectric layer; and
a continuous circuit including the plurality of acoustic wave resonators each including the first IDT electrode and the second IDT electrode and being continuously connected;
each of the first IDT electrode and the second IDT electrode of the plurality of acoustic wave resonators includes a pair of busbars;
the continuous circuit includes a plurality of wires and the plurality of wires include each of the pairs of busbars;
the plurality of wires located at ends of the continuous circuit are each an end portion wire; and
the end portion wire including a busbar of the pair of busbars of the first IDT electrode and the end portion wire including a busbar of the pair of busbars of the second IDT electrode in each of the acoustic wave resonators provided with the busbars included in the end portion wire are connected by the plurality of through electrodes.

2. The filter device according to claim 1, wherein
the plurality of wires in the continuous circuit located at positions other than the ends of the continuous circuit are each a non-end portion wire;
the non-end portion wire includes a busbar out of at least one of the pairs of busbars which is not located at the ends of the continuous circuit; and
the non-end portion wire including another busbar of the pair of busbars of the first IDT electrode and the non-end portion wire including another busbar of the pair of busbars of the second IDT electrode in at least one of the acoustic wave resonators of the continuous circuit are connected by the plurality of through electrodes.

3. The filter device according to claim 2, wherein in each of all of the acoustic wave resonators of the continuous circuit,
the non-end portion wire including the another busbar of the pair of busbars of the first IDT electrode and the non-end portion wire including the another busbar of the pair of busbars of the second IDT electrode are connected by the plurality of through electrodes.

4. The filter device according to claim 1,
wherein the plurality of wires include the pair of busbars of either of the first IDT electrode or the second IDT electrode.

5. The filter device according to claim 1, wherein
the filter device is a ladder filter including at least one series arm resonator and at least one parallel arm resonator; and
each of the plurality of acoustic wave resonators including the first IDT electrode and the second IDT electrode is either of the series arm resonator or the parallel arm resonator.

6. The filter device according to claim 1, wherein
each of the acoustic wave resonators including the first IDT electrode and the second IDT electrode is a first acoustic wave resonator; and the filter device further includes at least one second acoustic wave resonator including:

a piezoelectric substrate including a piezoelectric layer with a third major surface and a fourth major surface located opposite from each other; and a third IDT electrode on one of the third major surface or the fourth major surface.

7. The filter device according to claim 6, wherein the first acoustic wave resonator and the second acoustic wave resonator share the piezoelectric substrate;

the first major surface and the third major surface are a same major surface; and the second major surface and the fourth major surface are a same major surface.

8. The filter device according to claim 1, wherein the piezoelectric substrate includes:

a support substrate; and an intermediate layer between the support substrate and the piezoelectric layer.

9. The filter device according to claim 1, wherein at least one of the plurality of through electrodes includes a side surface that faces the piezoelectric layer; and the side surface is inclined with respect to a line normal to the first major surface of the piezoelectric layer.

10. The filter device according to claim 1, wherein a shape of at least one of the plurality of through electrodes in plan view is not provided with an angulated portion.

11. The filter device according to claim 1, wherein electrode finger pitches of the first IDT electrode and the second IDT electrode are equal.

12. The filter device according to claim 1, further comprising reflectors at both ends of each of the first IDT electrode and the second IDT electrode.

13. The filter device according to claim 12, wherein a material of the first IDT electrode, the second IDT electrode, and the reflectors is the same.

14. The filter device according to claim 12, wherein each of the first IDT electrode, the second IDT electrode, and the reflectors includes a laminated metal film.

15. The filter device according to claim 1, wherein intersecting regions of the first IDT electrode and the second IDT electrode overlap each other in a plan view.

16. The filter device according to claim 1, further comprising an additional continuous circuit, each of the continuous circuit and the additional circuit including three or more acoustic wave resonators including the first IDT electrode and the second IDT electrode.

17. The filter device according to claim 1, further comprising a dielectric film on the piezoelectric layer.

18. The filter device according to claim 1, wherein the filter device is a ladder filter including a plurality of series arm resonators and a plurality of parallel arm resonators sharing the piezoelectric substrate.

19. The filter device according to claim 18, wherein the plurality of series arm resonators and the plurality of parallel arm resonators define the continuous circuit and an additional continuous circuit.

20. The filter device according to claim 19, wherein in each of the continuous circuit and an additional continuous circuit, the end portion wire including the busbar of the pair of busbars of the first IDT electrode and the end portion wire including the busbar of the pair of busbars of the second IDT electrode in each of the acoustic wave resonators provided with the busbars included in the end portion wire are connected by the plurality of through electrodes.

* * * * *